US012718875B2

(12) United States Patent
Kumar Krovi et al.

(10) Patent No.: US 12,718,875 B2
(45) Date of Patent: Aug. 25, 2026

(54) STORAGE CIRCUITS WITH TRACKER BITLINE CONTROL

(71) Applicant: Arm Limited, Cambridge (GB)

(72) Inventors: Sunil Kumar Krovi, Bangalore (IN); Dharmesh Kumar Sonkar, Bangalore (IN); Rangavdhoot Bhupendrakumar Rawal, Bangalore (IN)

(73) Assignee: Arm Limited, Cambridge (GB)

( * ) Notice: Subject to any disclaimer, the term of this patent is extended or adjusted under 35 U.S.C. 154(b) by 87 days.

(21) Appl. No.: 18/610,381

(22) Filed: Mar. 20, 2024

(65) Prior Publication Data

US 2025/0246233 A1 Jul. 31, 2025

(30) Foreign Application Priority Data

Jan. 30, 2024 (IN) ............................ 202411005987

(51) Int. Cl.
*G11C 11/419* (2006.01)

(52) U.S. Cl.
CPC .................................. *G11C 11/419* (2013.01)

(58) Field of Classification Search
CPC ............................ G11C 11/418; G11C 11/419
USPC .......................................................... 365/154
See application file for complete search history.

(56) References Cited

U.S. PATENT DOCUMENTS

| | | | | |
|---|---|---|---|---|
| 8,116,119 | B1 * | 2/2012 | Peng | G11C 8/16 365/210.1 |
| 8,279,659 | B2 * | 10/2012 | Cho | G11C 7/227 365/194 |
| 9,697,890 | B1 * | 7/2017 | Wang | G11C 7/12 |
| 2007/0019461 | A1 * | 1/2007 | Adams | G11C 11/413 365/154 |
| 2015/0187397 | A1 * | 7/2015 | Hsu | G11C 29/44 365/189.15 |
| 2017/0278564 | A1 * | 9/2017 | Hsu | G11C 7/12 |
| 2025/0087257 | A1 * | 3/2025 | Wu | G11C 8/08 |

* cited by examiner

*Primary Examiner* — Sung Il Cho
(74) *Attorney, Agent, or Firm* — DeWitt LLP

(57) ABSTRACT

A storage system and circuits therefor. A storage system includes a bitcell array comprising a plurality of storage cells arranged in one or more columns and one or more rows; a read bitline associated with a first column to access storage cells of the first column, wherein the read bitline has a first keeper circuit coupled thereto; and a tracker bitline associated with the read bitline, wherein the tracker bitline has a second keeper circuit coupled thereto, and wherein the tracker bitline is configured such that a behaviour thereof is to substantially match a behaviour of the read bitline.

18 Claims, 12 Drawing Sheets

STORAGE CIRCUITS WITH TRACKER BITLINE CONTROL

CLAIM TO PRIORITY

This application claims priority to Indian Application Ser. No. 202411005987 filed Jan. 30, 2024, the entire disclosure of which is incorporated herein by reference.

TECHNICAL FIELD

The present techniques relate to a storage system and circuits therefor.

BACKGROUND

A memory circuit may consist of an array of storage or memory cells, where a read bit line (RBL) is coupled to an internal node of a storage cell to allow the data value stored in that storage cell to be read during a read operation.

When the RBL is addressed during a read operation, a voltage on the bit line (BL) will either stay at a first voltage level, or will discharge towards a second voltage level, depending on the value stored within the particular storage cell. During a period that a read word line signal is asserted, a sense amplifier connected to the RBL will monitor the voltage on the RBL, and when the voltage transitions to a threshold voltage level between the first and second voltage levels during the read operation, the sense amplifier will determine that the storage cell stores a first value, whilst if it does not transition to the threshold voltage level the sense amplifier will determine that the storage cell stores a second value.

However, any particular RBL will typically have a plurality of columns where each column will comprise multiple storage cells coupled thereto, with only one of those storage cells being addressed during a particular read operation. During the read operation, there may be some leakage current due to the other storage cells coupled to the RBL, with the amount of leakage current depending on a number of factors, for example the data values stored within those storage cells, where such leakage may affect performance leading to incorrect read operations.

SUMMARY

The present techniques relate to addressing or mitigating performance issues in storage systems and are particularly applicable to single ended storage systems.

In a first approach there is provided a storage system comprising: a bitcell array comprising a plurality of storage cells arranged in one or more columns and one or more rows; a read bitline associated with a first column to access storage cells of the first column, wherein the read bitline has a first keeper circuit coupled thereto; and a tracker bitline associated with the read bitline, wherein the tracker bitline has a second keeper circuit coupled thereto, and wherein the tracker bitline is configured such that a behaviour thereof is to substantially match a behaviour of the read bitline.

In a further approach there is provided a method of operating a storage system, the storage system including: a bitcell array comprising a plurality of storage cells arranged in one or more columns and one or more rows; a read bitline associated with a first column to access storage cells of the first column, wherein the read bitline has a keeper circuit coupled thereto; and a tracker bitline associated with the read bitline, wherein the tracker bitline has a second keeper circuit; the method comprising: enabling the keeper circuit and the second keeper circuit during a read operation, wherein a behaviour of the tracker bitline is configured to substantially match a behaviour of the read bitline.

In a further approach there is provided a method, comprising: providing storage circuitry with a bitcell array comprising a plurality of storage cells arranged in one or more columns and one or more rows; coupling a read bitline read bitline to a first column for accessing storage cells of the first column, coupling a first keeper circuit to the read bitline; providing a tracker bitline associated with the read bitline; coupling a second keeper circuit to the tracker bitline, wherein a behaviour of the tracker bitline is configured to substantially match a behaviour of the read bitline.

In a further approach there is provided a system comprising: the above circuitry, implemented in at least one packaged chip; at least one system component; and a board, wherein the at least one packaged chip and the at least one system component are assembled on the board.

In a further approach there is provided a chip-containing product comprising the above system assembled on a further board with at least one other product component.

In a further approach there is provided a non-transitory computer-readable medium to store computer-readable code for fabrication of the above circuitry.

BRIEF DESCRIPTION OF THE DRAWINGS

Implementations of the disclosed technology will now be described, by way of example only, with reference to the accompanying drawings, in which.

DETAILED DESCRIPTION

Various implementations described herein are directed to dummy bitline (DBL) circuitry for a storage circuit and such applications.

Figure 1:
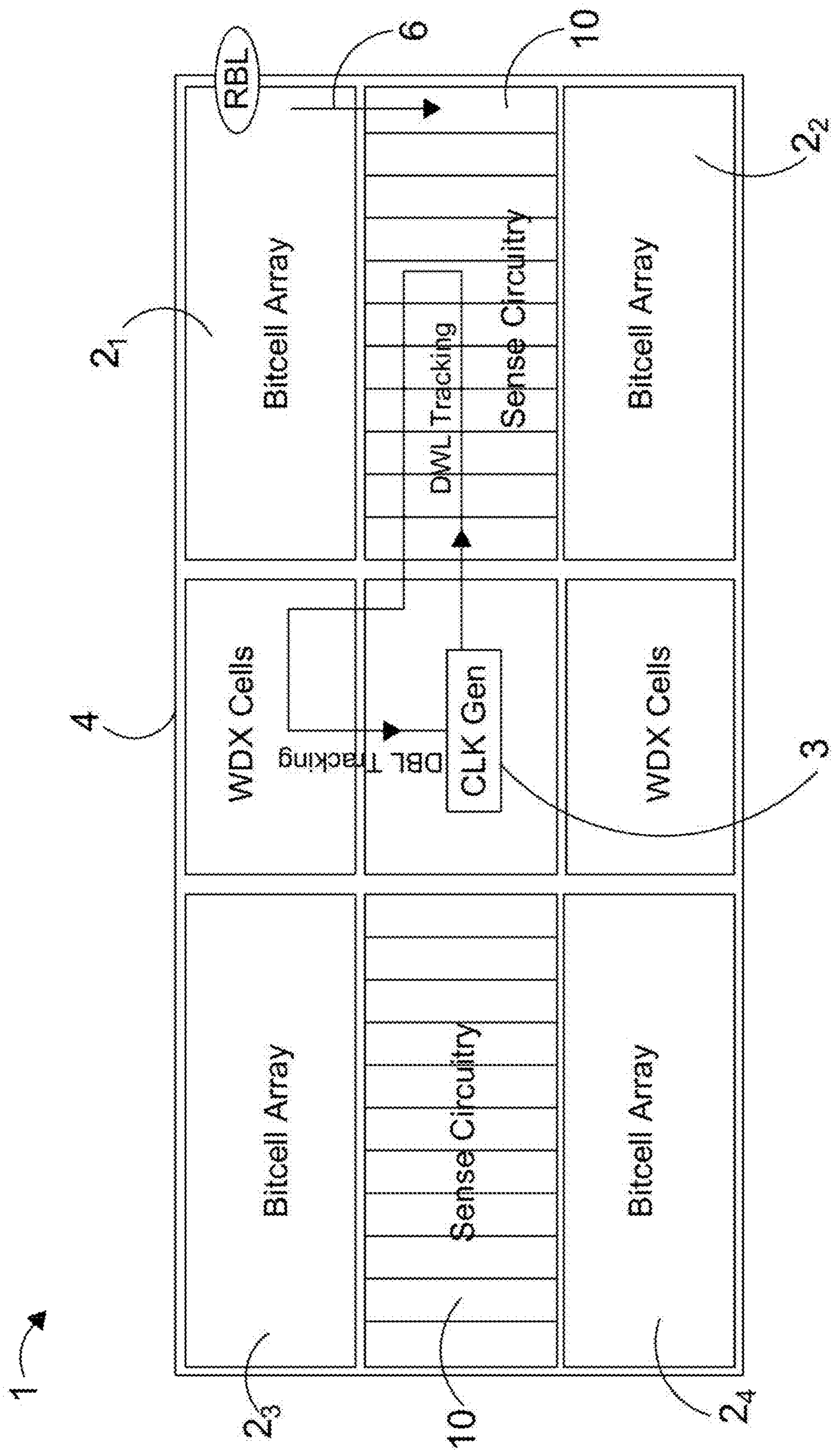
FIG. 1 shows a simplified view of a single ended storage system.
Figure 2A:
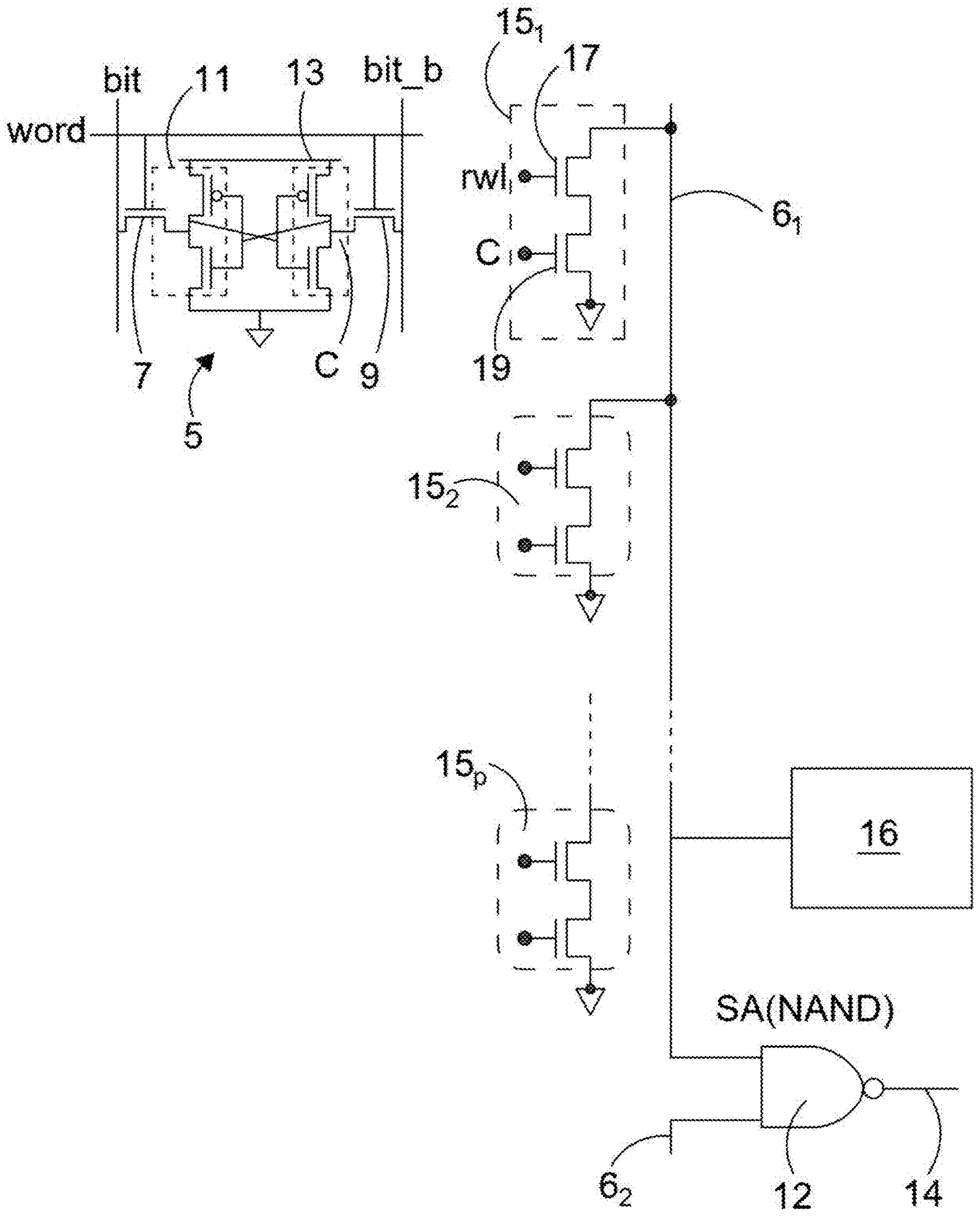
FIG. 2*a* shows a simplified diagram of a read bit line of the single ended storage system of FIG. 1.
Figure 2B:
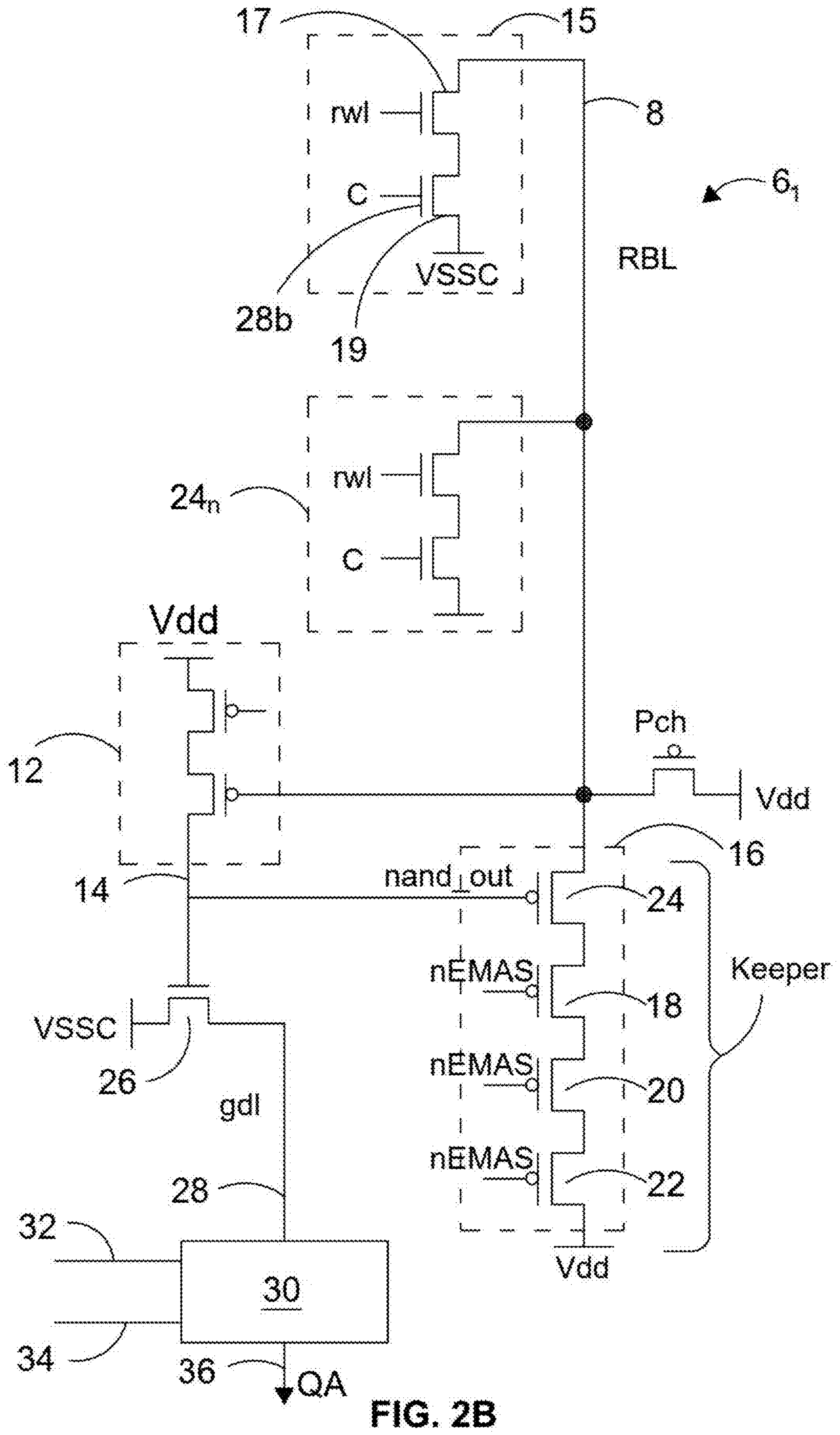
FIG. 2*b* shows a shows a more detailed diagram of a read bit line of the single ended storage system.

FIG. 1 shows a simplified view of a storage system 1. FIG. 2*a* shows a simplified diagram of a read bit line 61 of the storage system 1 and FIG. 2*b* shows a more detailed diagram of the read bit line 61 of storage system 1.

In the following examples the storage system 1 comprises a single ended storage circuit, and may include Read-only memory (ROM) storage circuits, RF2P (register file dual port) or any storage circuits having a single read port.

Figure 3:
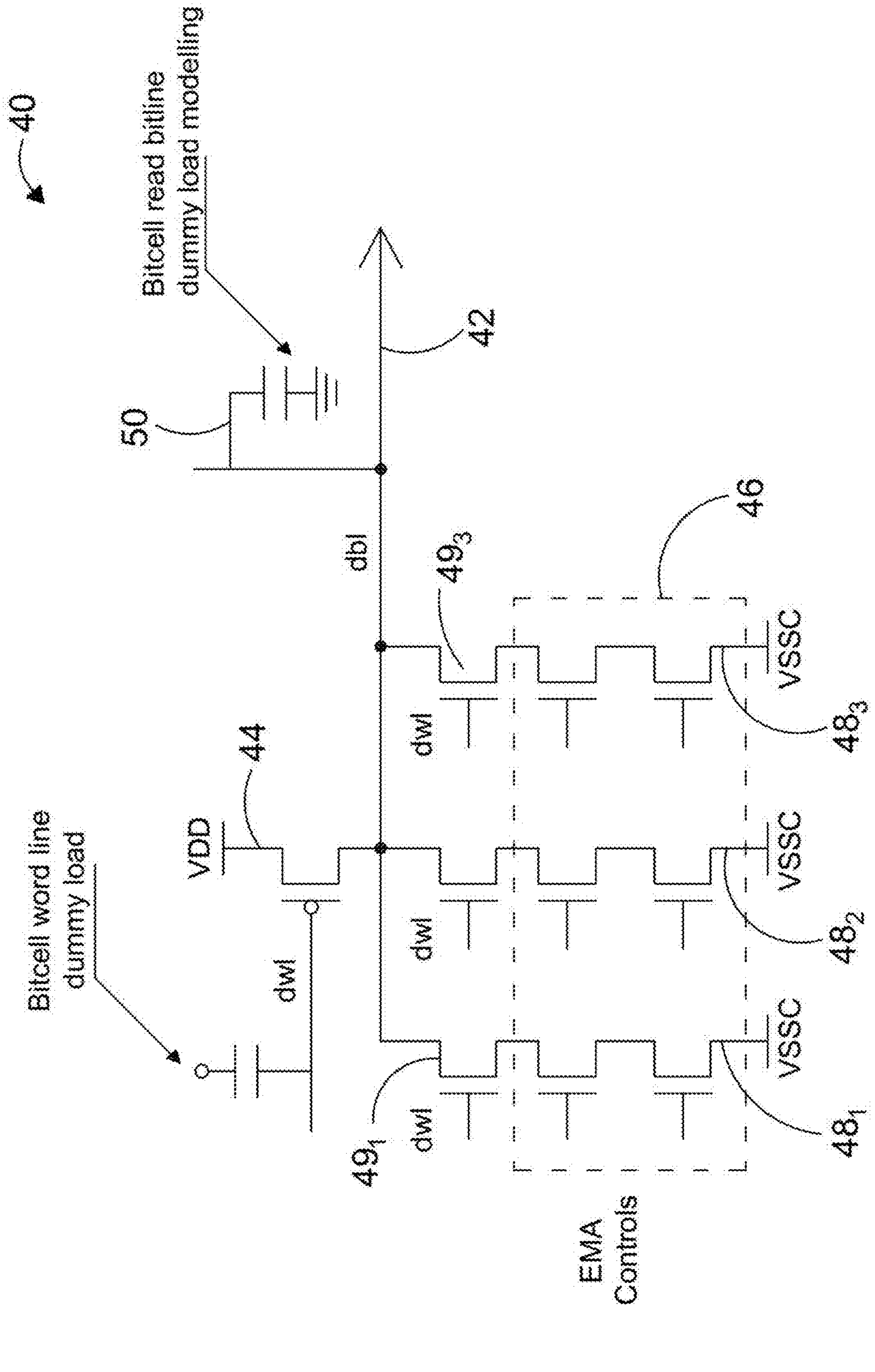
FIG. 3 shows a simplified diagram of a dummy bit line.

The storage system 1 comprises various components and circuits, an overview of which is provided in FIGS. 1 to 3. Whilst in an embodiment the storage system 1 may comprise a single block structure, in an alternative embodiment multiple block structures (e.g. bitcell array blocks, WDX cell blocks, sense circuitry blocks, clock generation block), may be used to form the storage system 1 such as depicted in FIG. 1.

Storage system 1 comprises one or more bitcell arrays $\mathbf{2}_n$ (four of which $\mathbf{2}_1$-$\mathbf{2}_4$ are depicted in FIG. 1), where each bitcell array $\mathbf{2}_n$ comprises a plurality of storage cells 5 (depicted in FIG. 2*a*) arranged as a plurality of rows and columns therein, each row of a particular bitcell array $\mathbf{2}_n$ being coupled to an associated read word line (RWL) (not shown in FIG. 1) to provide access to the storage cells coupled thereto in a read or write operation, and each column of storage cells of a particular bitcell array $\mathbf{2}_n$ being coupled to an associated read bit line (RBL) to provide access to the storage cells coupled thereto in a read or write operation.

Considering the block structure of FIG. 1, four bitcell arrays are depicted, two ($\mathbf{2}_1$ and $\mathbf{2}_2$) on the right-hand side of FIG. 1 and two ($\mathbf{2}_3$ and $\mathbf{2}_4$) on the-left hand side of FIG. 1.

Accordingly, in this embodiment each column of storage cells within the top bitcell array $\mathbf{2}_1$ will be connected to an associated RBL 6, and each column of storage cells within the bottom bitcell array $\mathbf{2}_2$ will also be connected to an associated, different, RBL (depicted as "Bottom RBL" in FIG. 2*a*).

Looking at the right-hand side, and at the top bitcell array $\mathbf{2}_1$ and the bottom bitcell array $\mathbf{2}_2$, both of these bitcell arrays share the same sense circuitry $\mathbf{10}_1$. Looking at the left-hand side, and at the top bitcell array $\mathbf{2}_3$ and the bottom bitcell array $\mathbf{2}_4$, both of these bitcell arrays share the same sense circuitry $\mathbf{10}_2$. Such sense circuitry may comprise sense amplifiers to receive a signal from a respective RBL (i.e. a rbl signal) and to output a sense circuit output to, for example, a global data line (GDL) 28 (see FIG. 2*b*). In an illustrative example a sense amplifier comprises a NAND gate structure 12 to produce a consolidated sense amplifier output for a pair of RBLs (i.e. a first RBL for a column of storage cells of the first bitcell array and a second RBL for a column of storage cells of the second bitcell array).

The storage system 1 may include clock generation circuitry 3 that may receive a clock signal CLK (e.g. an external clock signal) and may provide an internal clock signal as a global timing pulse (gtp) signal to various functional units to initiate a particular operation, such as enabling various column access drivers and read/write controllers. The gtp (or an inverted or modified form of it i.e. ngtp or ngtpa) may, for example, be provided to a latch circuit 30 as a latch control signal to cause the latch circuit to output a latch signal QA to initiate a read or write operation.

The clock generation circuitry 3 comprises self-timed clock generation circuitry which may receive one or more signals via a self-time path 17, a portion of which is depicted in FIG. 1.

The self-time path may comprise one or more dummy (or tracker) bitlines (DBL) for tracking the behaviour of an associated RBL and one or more dummy wordlines (DWL) for tracking the behaviour of an associated word bitline (WBL).

In present embodiments, tracking behaviour of a subject component, circuit or element may be determined by monitoring or analysing properties or characteristics of the subject component, circuit or element itself or another component, circuit or element on which the subject component has an effect.

Taking a RBL as a subject circuit, the behaviour of the RBL can be determined by analysing properties or characteristics of the rbl signal output therefrom, where the properties or characteristics of the rbl signal are indicative of the behaviour of the RBL. As an illustrative example, when the rbl is a pulse signal, the pulse width, frequency, pulse height or level are all indicative of the behaviour of the RBL.

Similarly, taking a DBL as a subject circuit, the behaviour of the DBL can be determined by analysing properties or characteristics of the DBL (e.g. the rate of propagation of a signal therethrough) or by analysing properties or characteristics of the dbl signal output therefrom, where the properties or characteristics of the dbl signal are indicative of the behaviour of the DBL. As an illustrative example, when the dbl is a pulse signal, the pulse width, frequency, pulse height or level are all indicative of the behaviour of the DBL.

Tracking behaviour of a subject component, circuit or element may additionally or alternatively comprise modifying one or more properties or characteristics of the subject component, circuit or element to modify the behaviour of the subject component to more closely match the behaviour of a further component, circuit or element.

As an illustrative example, a dummy keeper circuit may be enabled to cause the behaviour of the DBL to match the behaviour of the RBL, where the dummy keeper circuit may control the rate and/or level of charge/discharge from the DBL to match or substantially match the rate and/or level of charge/discharge from the RBL or cause the DBL to generate dbl signals substantially the same (or substantially the same) properties or characteristics as a corresponding signal output from the RBL (e.g. pulse width, pulse length or frequency).

The storage system 1 may also include row decoder circuitry (not shown), wordline driver circuitry (not shown), and a column multiplexer circuitry (not shown). In some instances, the row decoder may be used to access each bitcell of a bitcell array $\mathbf{2}_n$ via a selected wordline that is driven by the wordline driver (not shown). In the present embodiments the combination of the row decoder and the wordline driver are depicted as WDX cells 4.

Control circuitry may adjust or modify one or more properties of the circuitry of the storage system 1 responsive to signals on the self-time path (e.g. one or more properties of the gtp, or one or more thresholds (e.g. read margins)).

For a read operation of a storage cell of bitcell array $\mathbf{2}_1$, the rwl signal will be asserted to activate the storage cells within an addressed row of the bitcell array $\mathbf{2}_1$, and accordingly considering a particular pair of top RBLs $\mathbf{6}_1$ and bottom RBLs $\mathbf{6}_2$, where (only) the addressed storage cell connected to those pair of RBLs $\mathbf{6}_1$ or $\mathbf{6}_2$ will be activated via the respective read access logic $\mathbf{15}_1$-$\mathbf{15}_p$ along the RBL $\mathbf{6}_1$ (where P is an integer ≥1).

During the read operation, the addressed storage cell will discharge the voltage on its associated RBL towards the logical LOW or low voltage level (typically a ground voltage level (VSS)) when a data value stored in that activated or addressed storage cell has a first value. If instead the data value in the activated or addressed storage cell is at a second value, no such discharging will be performed and the RBL will remain at the logical HIGH or high voltage level (typically VDD). The voltage levels may be set by a user dependent on requirement. For example, a first user may require the storage system to operate in a first voltage domain (e.g. VDD=1.1V) whereas another user may require the storage system to operate in a second voltage domain (e.g. VDD=0.6V). The claims are not limited to the example voltage domains above, and other voltage domains are possible, for example, (e.g. 0.5V etc.)

Due to the operation of the NAND gate structure 12, it will be appreciated that the sense output signal 14 will remain at a logic zero value (or LOW) when neither of the pair of RBLs is discharged, but will flip to a logic one value (of HIGH) when either one of the RBLs is discharged towards a logic zero level.

Therefore, when the activated storage cell stores the first value, the sense amplifier output 14 should flip from a logic zero value to a logic one value during the period whilst the rwl pulse signal is asserted, and the load access logic is enabled but when the activated storage cell stores the second value the sense amplifier output should not flip, and instead should remain at the logic zero level.

Looking at FIGS. 2*a* & 2*b*, RBL $\mathbf{6}_1$ provides one input to the NAND gate 12. The bottom read bit line $\mathbf{6}_2$ provides a further input and will have the same arrangement of components connected to it as are shown in FIG. 2*a* in respect of the top read bit line $\mathbf{6}_2$.

FIG. 2*a* depicts an example storage cell 5, which in the present illustrative example comprises a 6 transistor (6T) arrangement. However, the claims are not limited in this respect and any suitable arrangement or number of transistors may be used for storage cell 5.

The storage cell depicted in FIG. 2*a* comprises two N-type Metal Oxide Semiconductor (NMOS) pass gate transistors 7, 9 and two pairs of NMOS and P-type Metal Oxide Semiconductor (PMOS) transistor arranged as two inverters 11, 13, but in addition read access circuitry (or coupling circuitry) $\mathbf{15}_1$ comprising first and second transistors 17, 19 is also provided for use during a read operation. In the read access circuitry $\mathbf{15}_1$ depicted in FIG. 2*a* the first and second transistors 17, 19 are depicted as NMOS transistors but the claims are not limited in this respect. In the read access circuitry depicted in FIG. 2*a* the first transistor 17 is controlled by read word line (rwl) signal and the second transistor 19 is controlled by a signal (depicted as "cored") which is provided by or obtained from an internal bitcell node (depicted as "C" in FIG. 2*a*) of the addressed storage cell.

During such a read operation of an addressed storage cell, a rwl signal on the transistor 17 will be asserted (E.g. by control logic), turning on the transistor 17 of the read access circuitry 15 and the RBL $\mathbf{6}_1$ may selectively discharge towards the logic zero (or LOW) level dependent on the value stored at the node C within the addressed storage cell 5. For example, when the node C of the addressed storage cell stores a first value, namely a logic one (or HIGH) value, this will turn on the NMOS transistor 19, and cause the RBL $\mathbf{6}_1$ to be discharged towards ground. Conversely, when the node C stores a logic zero value, the NMOS transistor 19 will not be turned on, and the voltage on the bit line should remain at the Vdd level. The sense amplifier output 14 will initially have an output at a logic zero level, but as discussed earlier that output will flip to a logic one level during the course of the read operation when the node C stores a logic one value and hence the RBL $\mathbf{6}_1$ is discharged.

It will be noted that multiple storage cells are coupled to the read bit line $\mathbf{6}_1$, each having associated read access circuitry $\mathbf{15}_1$ to $\mathbf{15}_p$. As device geometries shrink, it has been found that the leakage current through the read access circuitry has become more significant. In particular, whilst only one of the read access circuitry $\mathbf{15}_1$ to $\mathbf{15}_p$ within the column will have its transistor 17 turned on by an asserted read word line signal, the read access circuitry of the other non-addressed storage cells coupled to the RBL may contribute to leakage current. The most significant cause of the leakage current is from non-addressed memory cells that store at their respective nodes C a logic one value. In this situation, although the read access transistors 17 of the non-addressed storage cells are turned off, the read access transistors 19 of the non-addressed storage cells are turned on (due to the HIGH value at node C of the storage cells), and leakage current through the read access circuits $\mathbf{15}_1$ to $\mathbf{15}_p$ in that situation may pull the voltage on the RBL down towards the logic zero level. Some further leakage current may also occur in non-addressed memory cells where the node C stores a logic zero value, and indeed in connection with an addressed memory cell where node C stores a logic zero value (in which case the transistor 17 will be turned on but the transistor 19 will be turned off).

These effects due to leakage can potentially give rise to a situation where even though the addressed memory cell stores a logic zero value at its node C, and accordingly the bit line $\mathbf{6}_1$ should remain at the Vdd supply level during a read operation, the leakage current actually causes the voltage on the bit line to discharge, during the period in which the rwl signal is asserted on the read access circuit of the addressed storage cell, to an extent that the sense amplifier 12 flips its output state to a logic one (or High) value, thereby giving an incorrect read value.

To address or mitigate the effects of leakage currents a keeper circuit 16 is coupled to RBL $\mathbf{6}_1$ where the keeper circuit 16 conceptually takes the form illustrated in 2*b*, where a series of transistor 18, 20, 22 is driven by a keeper enable signal (nEMAS) and a further transistor in series with transistors 18, 20, 22 is driven by the output signal 14 (nand_out) of the sense amplifier 12, such that when the series of transistors 18, 20, 22, 24 are enabled, the voltage on the RBL $\mathbf{6}_1$ is pulled back towards the Vdd level. In this example, PMOS transistors are used, and hence the keeper enable signal (nEMAS) and output signal 14 (nand_out) of the sense amplifier 12 are asserted at a low logic level (e.g. 0) and de-asserted at a high logic level (e.g. 1).

The nEMAS signal and the EMAS, (where nEMAS is an inverted version of the EMAS signal) are keeper control signals provided as an external input to the storage system, for example from an application running in an associated circuit (e.g. central processor unit or graphics processor unit (not shown)).

As described above, there may be multiple columns in each bitcell array $\mathbf{2}_1$ to $\mathbf{2}_n$, where for example, and looking again at FIG. 1, the top bitcell array $\mathbf{2}_1$ and bottom top bitcell array $\mathbf{2}_2$ may each contain for example 16 storage cells within a column, and may comprise an RBL associated with each column, with read access circuitry $\mathbf{15}_1$ to $\mathbf{15}_p$ provided along the RBL to read a value in an associated storage cell 5. Each column in a pair of columns then provides a rbl signal to sensing circuitry 12 (depicted as a NAND gate) which outputs signal 14 responsive to the received rbl signals from the respective RBLS.

The output 14 from the sense circuit 12 is provided as an input signal for controlling an NMOS transistor 26, which, when enabled, provides a path to a voltage level (depicted as VSS) for GDL 28 to cause GDL 28 to provide a gdl signal to Q_latch control circuit 30.

Accordingly it will be seen that when any of the storage cells of a column include an addressed memory cell that stores a logic one value at its node C, then the sense circuit output 14 will transition to a logic one (HIGH) level during the read operation and hence turn on the corresponding NMOS transistor 26 that controls global data line (GDL) 28 to provide a gdl signal to latch circuit or Q_Latch circuit (hereafter latch circuit) 30.

Hence, the GDL 28 will be discharged towards a logic zero level when the addressed memory cell stores a logic one value at its node C. Otherwise, the gdl signal output will remain at a logic one level. The gdl signal can then be provided to a further circuit, such as the latch circuit 30 which outputs latch signal (QA) 36 to, for example, combination logic which is to register or capture the value on the RBL for the read operation (i.e. where QA is representative of the value taken to be stored in the addressed storage cell).

Latch circuit 30 receives the gdl signal output from the global bitline 28 (GDL) and, responsive to the gdl signal and latch control signal (Lat_e) 32 and latch control signal (Lat_en) 34, outputs latch signal (QA) 36. In the illustrative embodiment Latch control signal (Lat_e) 32 is an inverted version of the latch control signal (Lat_en) 34.

Although only one RBL is depicted as providing an output to control the GDL 28 in FIG. 2*b*, it will be appreciated that each column of storage cells in the storage system has an associated RBL, sense circuit, GDL and latch circuit.

Signals on the self-time path may be used to set/adjust characteristics (e.g. the pulse width) of other components, circuits or elements such as the internal clock signal, which in turn may be used to control the operation of various circuitry, components or elements such as the sense circuitry and latch circuitry for read or write operations to/from a particular storage cell. By tracking performance of the storage bitcells in the respective bitcell arrays, the appropriate sense circuitry can be enabled at the correct time during a read or write operation to facilitate reliable read or write operations.

FIG. 3 shows a schematic diagram of the DBL circuitry 40 which comprises a dummy bitline (DBL) 42 that provides a dummy bitline signal (dbl) on the self-time path of the storage system.

DBL 42 comprises a transistor 44 (depicted as an PMOS transistor) arranged between a first voltage level (depicted as VDD) and the DBL 42, where the transistor 44 is a PMOS transistor which is controlled responsive to the dummy wordline signal (dwl).

The dwl signal is generated in response to a gtp signal asserted by the internal clock, which itself is based on or derived from an external clock.

DBL circuitry 40 further comprises dummy line control circuitry 46 comprising three groups of transistors $\mathbf{48}_{1\text{-}3}$, where the transistors in each group are arranged in series between a second voltage level (Depicted as VSS) and DBL 42. Each group of transistors is arranged in parallel with respect to the other groups.

A first transistor $\mathbf{49}_{1\text{-}3}$ in each group $\mathbf{48}_{1\text{-}3}$ is controlled responsive to the dwl signal, whilst the remaining transistors are controlled responsive to control signals (depicted as EMA control signals). The transistors in each group $\mathbf{48}_{1\text{-}3}$ are depicted as NMOS transistors but the claims are not limited in this respect. Further each group $\mathbf{48}_{1\text{-}3}$ may have more (or less) than the three depicted on FIG. 3, and there may be less groups in the dummy line control circuity 46.

The EMA signal and the nEMA, (where nEMA is an inverted version of the EMA signal) are control signals which may be provided as an external input to the storage system, for example from an application running in an associated central processor unit or graphics processor unit (not shown).

The DBL circuitry 40 further comprises load circuitry 50 which is used to model the functionality of the associated RBL. For ease of illustration, a capacitive element is illustrated in the DBL circuitry 40. It is understood that the properties of the capacitive element may be based on modelling or testing during the design phase. A capacitive element is depicted in FIG. 3 (and FIG. 5*a* below). However, the claims are not limited in this respect and additional, or alternative, components such as a resistive components may be included so that an RC time constant is represented. An inductive component may be included in addition to or as an alternative to a capacitive and/or a resistive component.

An output of the DBL 42 (i.e. dbl signal) may be output on the self-time path, whereby control logic may derive information from the dbl signal. Such information may be used to determine whether the DBL is behaving similar to the RBL.

When the dwl is generated it will enable the transistor 44 and the DBL will be charged based on the state of the RBL.

Ideally, the characteristics or properties of the rbl signals from the RBL and dbl signals from the DBL 42 substantially match (or are at least substantially similar) such that the behaviour of the DBL 42 mimics (or at least substantially matches) that of the RBL. However as will become apparent that is not always the case.

Figure 4:
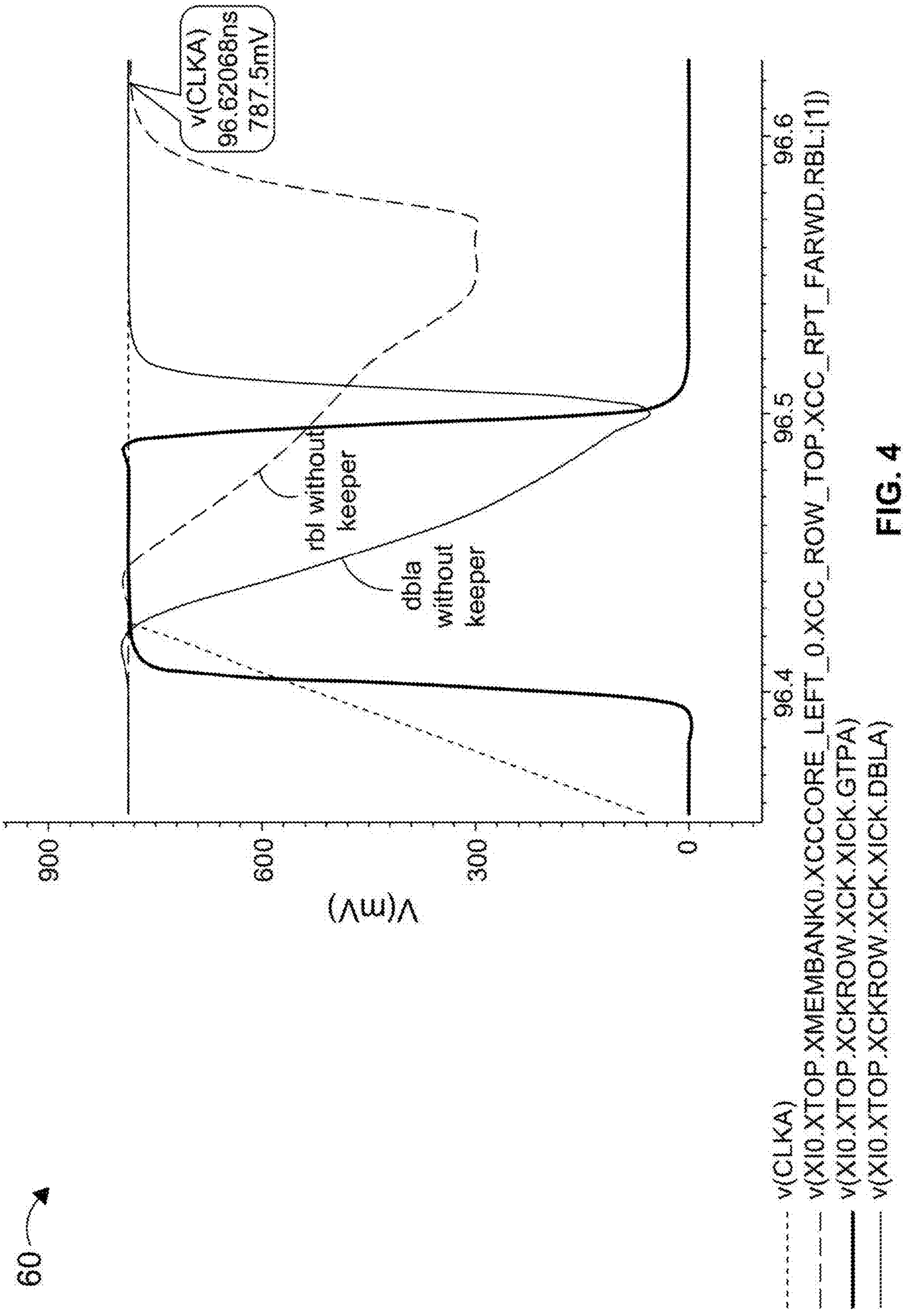
FIG. 4 is a graph which illustratively shows the output of the read bit line of FIG. 2*a* and the dummy bit line of FIG. 3.

FIG. 4 is a graph 60 which illustratively shows characteristics or properties the rbl and dbl signals from the respective RBL and DBL of FIG. 2*a* and FIG. 3 in response to a global timing pulse (gtp) from the internal clock signal being asserted. In FIG. 4, time (ns) is depicted along the X-axis and Voltage (mV) is depicted along the Y-axis. As is evident in FIG. 4, although the shape of the rbl signal from the RBL is somewhat similar to that of the dbl signal from the DBL, the measured waveforms are not particularly well aligned and the rbl signal lags the dbl signal, whilst the dbl signal is pulled to a lower voltage level compared to the rbl signal, whilst the rbl tracks its lowest voltage for a longer time period than the dbl signal waveform.

The difference(s) in properties or characteristics of the rbl and dbl signals (i.e. differences in the behaviour of the DBL and RBL) may be the result of, for example, process variations in the circuitry of the storage system during manufacture. The divergence in behaviour may also arise when operating across different voltage domains, where the voltage levels may be set by a user dependent on requirement. For example, a first user may require the storage system to operate in a first voltage domain (e.g. VDD=1.1V) whereas another user may require the storage system to operate in a second voltage domain (e.g. VDD=0.6V). The claims are not limited to the example voltage domains above, and other voltage domains are possible, for example, (e.g. 0.5V etc.)

Whilst some mitigation actions may be taken to reduce divergence in behaviour of the DBL and RBL for a particular voltage domain, such as adding delay logic (e.g. invertors) on the DBL during design/manufacture, the delay required for one particular voltage domain may not provide the same results in a second voltage domain. Thus, operational efficiency may reduce when operating the storage system across different voltage domains. Furthermore, adding such logic may result in an operational penalty (e.g. increased access time or cycle time).

The divergence may result in degraded performance due to unreliable or inefficient read or write operation. As an illustrative example, when the DBL closes faster than the RBL then the internal clock will close once the DBL is discharged and there may be an incorrect read or, at least, correct read operation may not be guaranteed. To mitigate such problematic functionality, control circuitry may, for example, modify the operation of the storage system to take account of the divergence.

As an illustrative example, a higher margin for the latch circuit may be enforced for when write/read operation is performed, where higher margins may result in increased access times.

Thus, reducing divergences in behaviour such that the behaviour of the DBL tracks RBL may lead to improved performance of a storage system and the present techniques relate to reducing such divergences in behaviour such that properties or characteristics of the dbl signal from the DBL match or are substantially similar to the rbl signals from the RBL.

Figure 5A:
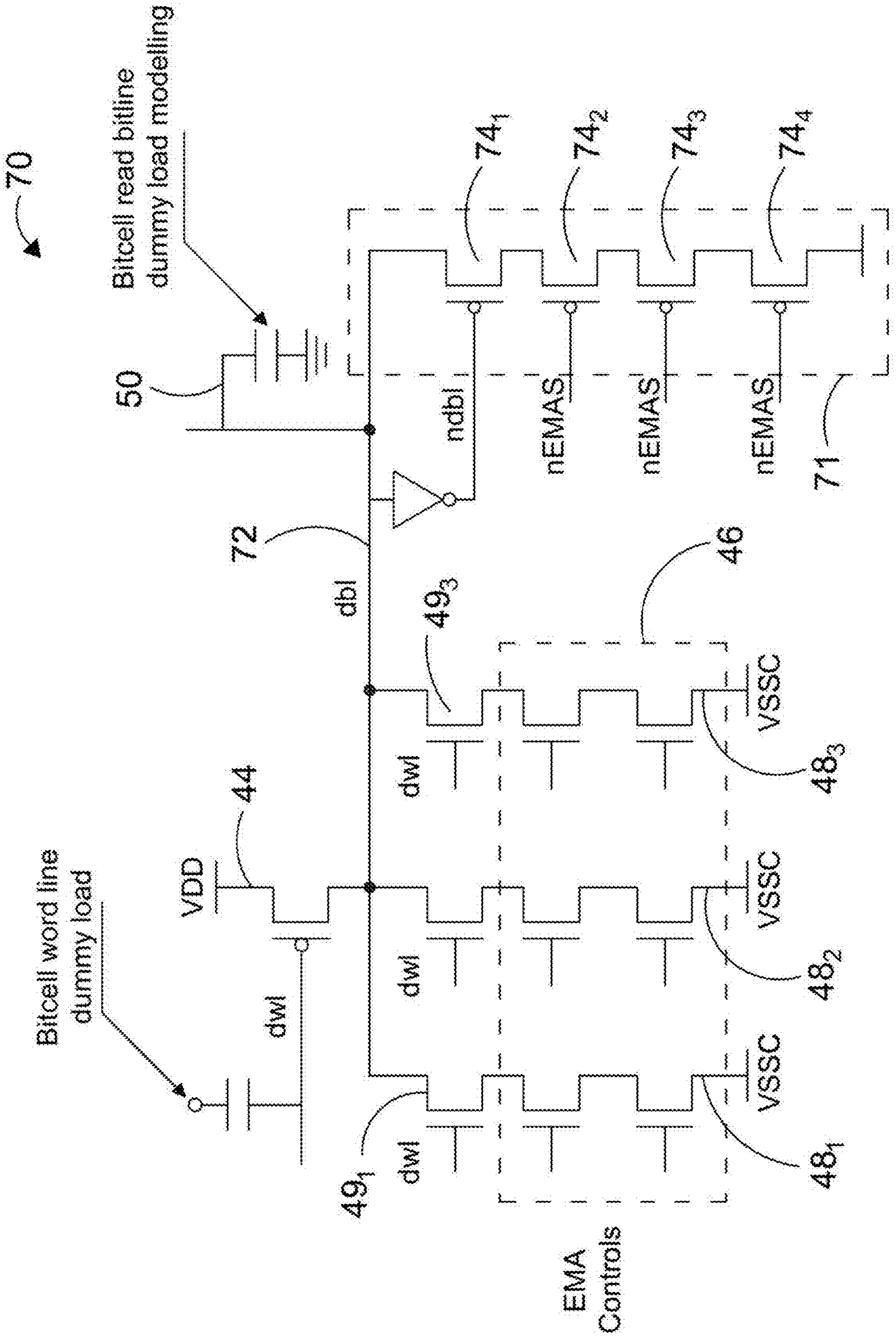
FIG. 5*a* shows a shows a simplified diagram of an example dummy bit line of the single ended storage system in accordance with the present techniques.
Figure 5B:
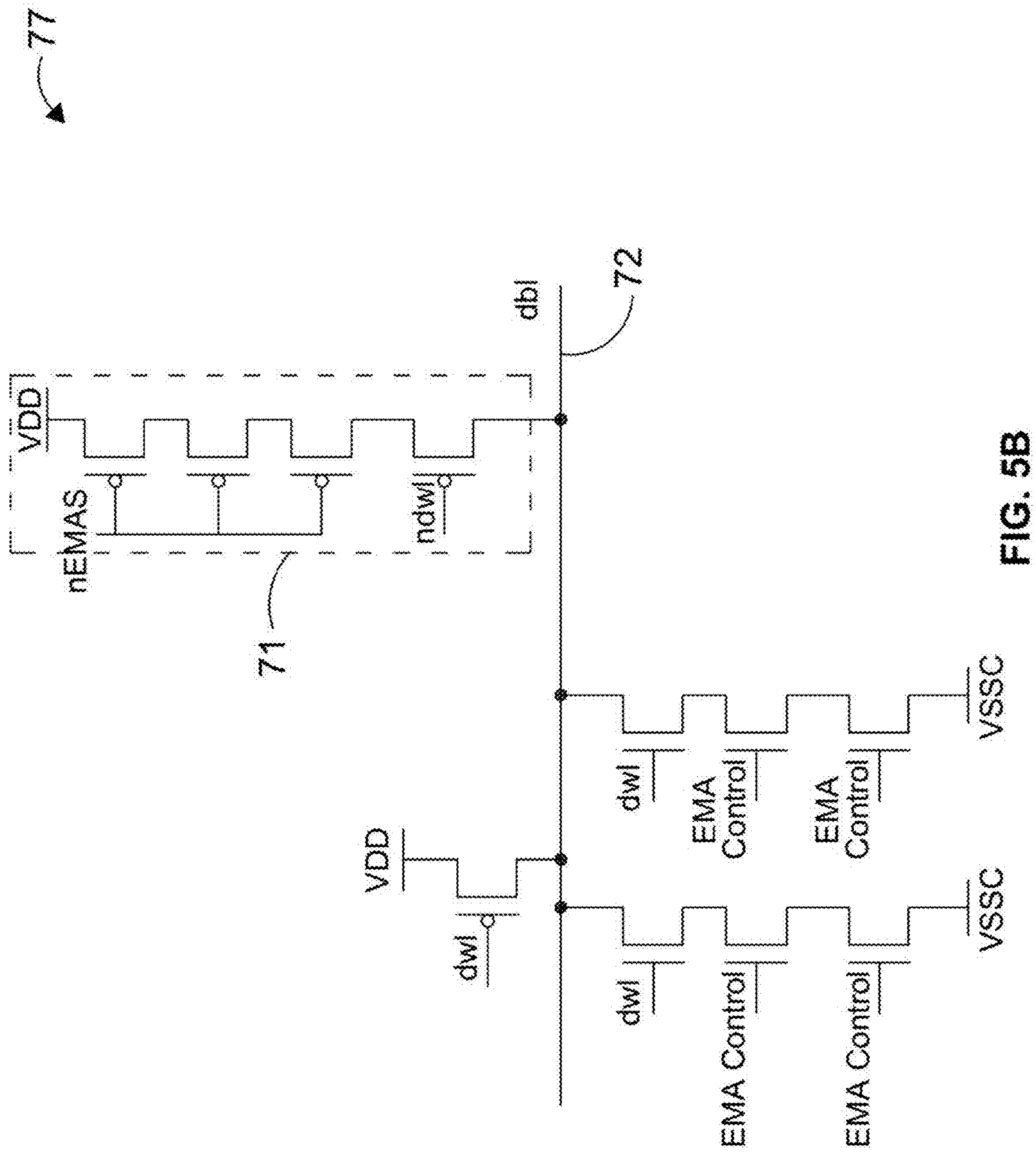
FIG. 5*b* shows a shows a simplified diagram of a further example dummy bit line of the single ended storage system in accordance with the present techniques.

FIG. 5*a* shows a schematic diagram of the DBL circuitry 70 in accordance with the present techniques. FIG. 5*b* shows a shows a further example of DBL circuitry 77 in accordance with the present techniques.

The DBL circuitry 70 is similar to that depicted in FIG. 3 but comprises a dummy keeper circuit 71 which provides for improved tracking or matching of the dbl signal to the rbl signal. Put another way, the dummy keeper circuit provides for reduced divergence in the behaviour of the DBL 72 and the RBL.

In the following illustrative example of FIG. 5*a*, the additional dummy keeper circuit 71 in the self-time path comprises a series of one or more transistors between the DBL 72 and a voltage (depicted as VSS).

In the illustrative example of FIG. 5*a*, the dummy keeper circuit 71 comprises four transistors $\mathbf{74}_{1\text{-}4}$ in series between the DBL 72 and VSS. Whilst the transistors $\mathbf{74}_{1\text{-}4}$ are depicted as PMOS transistors the claims are not limited in this respect.

In the dummy keeper circuit 71, a first transistor $\mathbf{74}_1$ is controlled responsive to the inverted DBL signal from DBL line 71 (i.e. nDBL), and the second to fourth transistors $\mathbf{74}_{2\text{-}4}$ are controlled responsive to the keeper pulse signal (nEMAS). In the present illustrative example, the keeper circuit and dummy keeper circuit are enabled responsive to the same signal.

When all the transistors of the dummy keeper circuit 71 are enabled (i.e. when nEMAS and nDBL are LOW), there is a path from the DBL 71 to VSS which discharges the DBL in a similar manner as the RBL is discharged.

The output of the DBL is on the self-time path of the storage system 1 and may be used to control the properties of the latch clock signal which may be used to confirm the value of a storage cell during a read or write operation. For example, the output of the DBL may be used to set the pulse width for the latch clock (or the gtp), such that when a relatively high margin is enforced there is a relatively longer latch clock before a write/read operation is performed, whilst when a relatively small margin is enforced there is a relatively shorter latch clock before a before a write/read operation is performed.

As above, increased divergence in behaviour between a DBL and RBL may negatively affect performance because a larger margin may be enforced in response to the increased divergence in behaviour. However, the dummy keeper circuit 72 provides for improved tracking of the actual RBL behaviour by the DBL.

Furthermore, the storage system 1 can, using control logic, take active mitigation action in response to determining that one or more characteristics or properties of the dbl signal have diverged or are outside a specified threshold when compared to the one or more characteristics or properties of the rbl signal (i.e. that the behaviour of the DBL has diverged beyond specified margin). For example, the control logic can set adjust the length of the gtp pulse (e.g. to increase the amount of time a latch circuit will take to issue an output signal when divergence is greater than the specified margin or to decrease the amount of time a latch circuit will take to issue an output signal when divergence is within a specified margin).

The dummy keeper circuit 71 also provides support across a wide range of voltage domains, where the divergence in the behaviour of the self-timing circuit comprising DBL 72 and the RBL is reduced in comparison to the self-timing circuit comprising DBL 42 across different voltage domains because the dummy keeper circuit can be adjusted, e.g. in response to the keeper pulse signal (nEMAS) dependent on the voltage domain in which the storage system 1 is operating (e.g. 0.6V, 1.2V, 1.8V etc) dependent on the requirements of, for example, a user.

FIG. 4 above is a graph 60 which illustratively depicts the measured waveforms are not particularly well aligned and the rbl signal lags the dbl signal, whilst the dbl signal is pulled to a lower voltage level compared to the rbl signal, whilst the rbl tracks its lowest voltage for a longer time period than the dbl signal waveform. Thus, the behaviour of the DBL is not particularly well aligned with that of the RBL.

Figure 6:
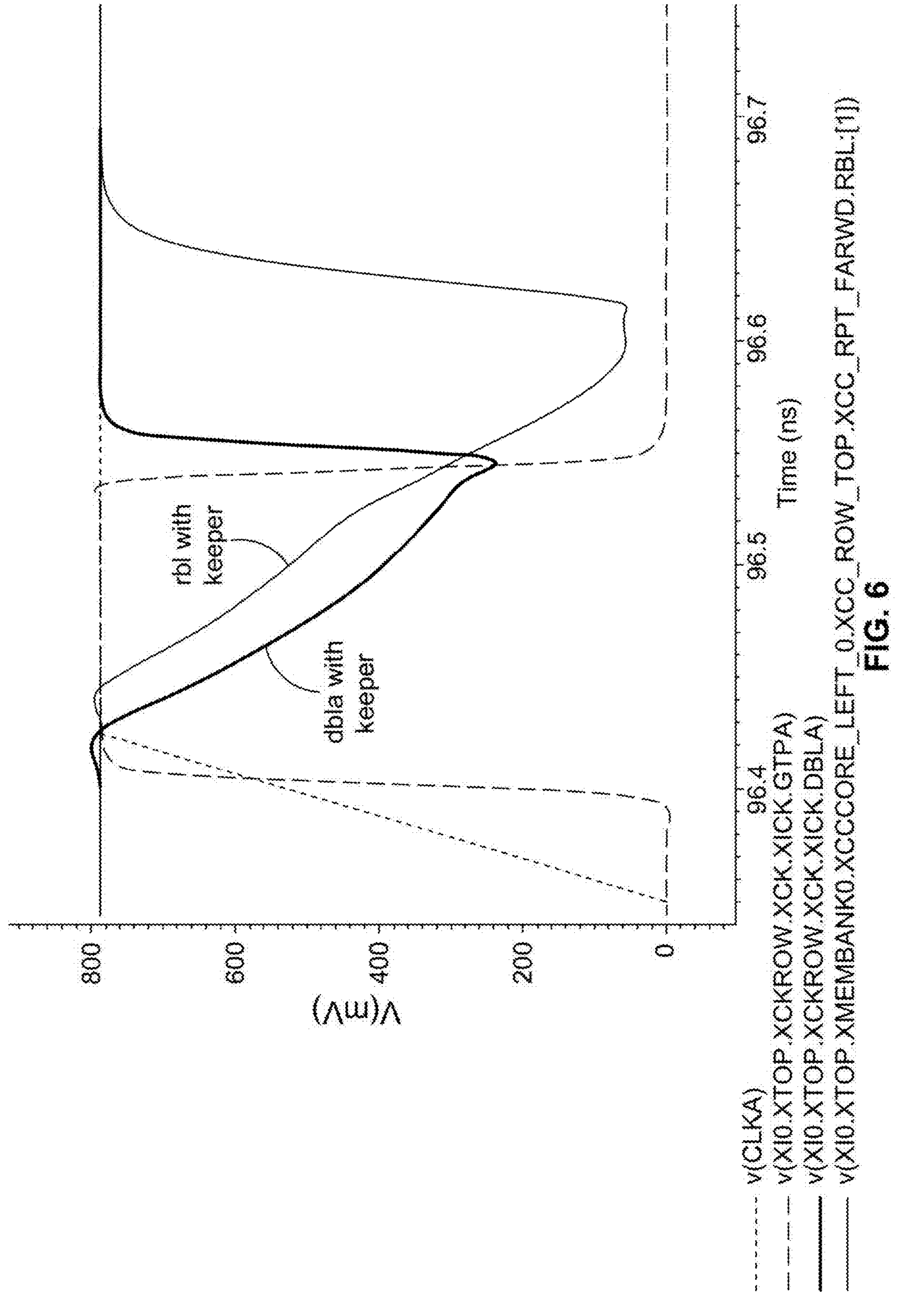
FIG. 6 is a graph which illustratively shows the output of the read bit line of FIG. 2*a* and the dummy bit line of FIG. 5*a;*

FIG. 6 comprises a graph 60 which illustratively shows characteristics or properties the rbl signals and dbl signals from the respective RBL and DBL of FIG. 2*a* and FIG. 5*a* in response to a global timing pulse (gtp). In FIG. 6, time (ns) is depicted along the X-axis and Voltage (mV) is depicted along the Y-axis. As is evident from FIG. 6, the waveform representing the dbl signal from DBL 72 having the dummy keeper circuit follows the waveform representing the RBL more closely than that of the waveform representing the DBL 42 without the dummy keeper circuit (as compared to the waveform in FIG. 4). Thus, the divergence in the behaviour of dummy bitline circuit 70 comprising the dummy keeper circuit on the DBL 72 and the RBL is reduced in comparison to the dummy bitline circuit 40 without a dummy keeper circuit on the DBL 42 (i.e. the behaviour of the DBL having the dummy keeper circuit substantially matches that of the RBL).

Looking again at the DBL circuit 70, the first transistor $\mathbf{74}_1$ in the dummy keeper circuit 71 of FIG. 5*a* is controlled responsive to the inverted dbl signal. Thus, when the dbl signal is high the inverted dbl signal will be low and the PMOS transistor $\mathbf{74}_1$ will be enabled. When the remaining PMOS transistors $\mathbf{74}_{2\text{-}4}$ are enabled (responsive to nEMAS signal being low which is asserted at substantially the same time as dbl being high) there will be a path from VSS to the RBL. However, when the DBL 72 is discharged and the dbl signal is low, the PMOS transistor 741 will be disabled and there will be no path from VSS to the DBL, and so the dummy keeper circuit 71 will have minimal impact on the DBL as it will be disabled.

In the illustrative example of FIG. 5*a*, the dummy keeper circuit 71 in the self-time path comprises a series of one or more transistors between the DBL 72 and the VSS. However, the dummy keeper circuit is not limited to such an arrangement. As an illustrative example, FIG. 5*b* shows a shows a further example of DBL circuitry 77 in accordance with the present techniques, where DBL circuitry comprises a dummy keeper circuit 79 arranged between another voltage (depicted as VDD) and the DBL 71.

As the dummy circuit is provided between the DBL and a first voltage level (e.g. VDD) or between the DBL and a second voltage level (e.g. VSS), and as voltage level will change dependent on the voltage domain in which the storage system is used, the dummy keeper circuit 71 can improve tracking of the behaviour of the DBL and RBL across different voltage domains.

Furthermore, whilst dummy keeper circuit 71 is substantially similar to the keeper circuit of the RBL depicted in FIG. 2*b*, the claims are not limited in this respect and the keeper circuit on the RBL and the dummy keeper circuit 71 on the DBL may have different configurations/components.

Furthermore, the dummy keeper circuit is not limited to the configuration depicted in FIGS. 5*a* and 5*b* and other components such as NMOS transistors, diodes etc. may be used in addition to or as an alternative to the PMOS transistors depicted in FIGS. 5*a* and 5*b*.

Furthermore, whilst the dummy keeper circuit 71 is depicted as having four transistors the claims are not limited in this regards, and the dummy keeper circuit may comprise one or more transistors.

As an illustrative example, to reduce the impact on die area used by the dummy keeper circuit, the first PMOS transistor $\mathbf{74}_1$ may be removed such that the dummy keeper circuit comprises the three PMOS transistors $\mathbf{74}_{2\text{-}4}$ in series, such that the dummy keeper circuit will be enabled responsive to the nEMAS being low.

Furthermore, the dummy keeper circuit is not limited to using PMOS transistors and, in addition or as an alternative to the PMOS transistors, one or more NMOS transistors or diodes may be used.

Figure 7:
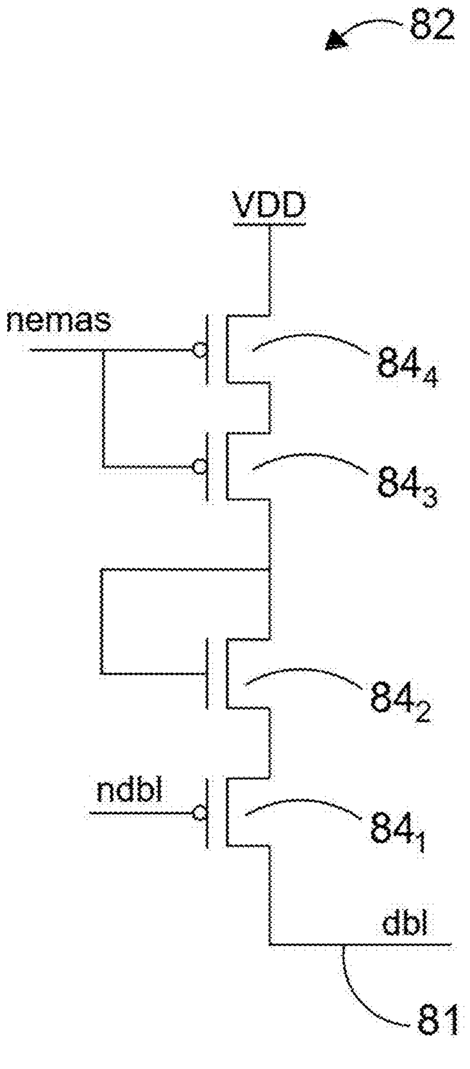
FIG. 7 shows a simplified view of an alternative dummy bit line of the single ended storage system in accordance with the present techniques.

A further illustrative example of a dummy keeper circuit 81 is depicted in FIG. 7, where four transistors $\mathbf{84}_1$ to $\mathbf{84}_4$ are arranged in series between the first voltage (depicted as VDD) and the DBL 81. In the dummy keeper circuit 81, a first transistor $\mathbf{84}_1$ (depicted as a PMOS transistor) is controlled responsive to the inverted dbl signal from DBL line 81 (i.e. ndbl), and a second transistor $\mathbf{84}_2$ (depicted as NMOS transistor) is controlled responsive to the output of third and fourth transistors $\mathbf{84}_3$ & $\mathbf{84}_4$, which are controlled responsive to the keeper pulse signal (nEMAS). Using one or more NMOS transistors may improve process variation in the fabricated integrated circuit.

Figure 8:
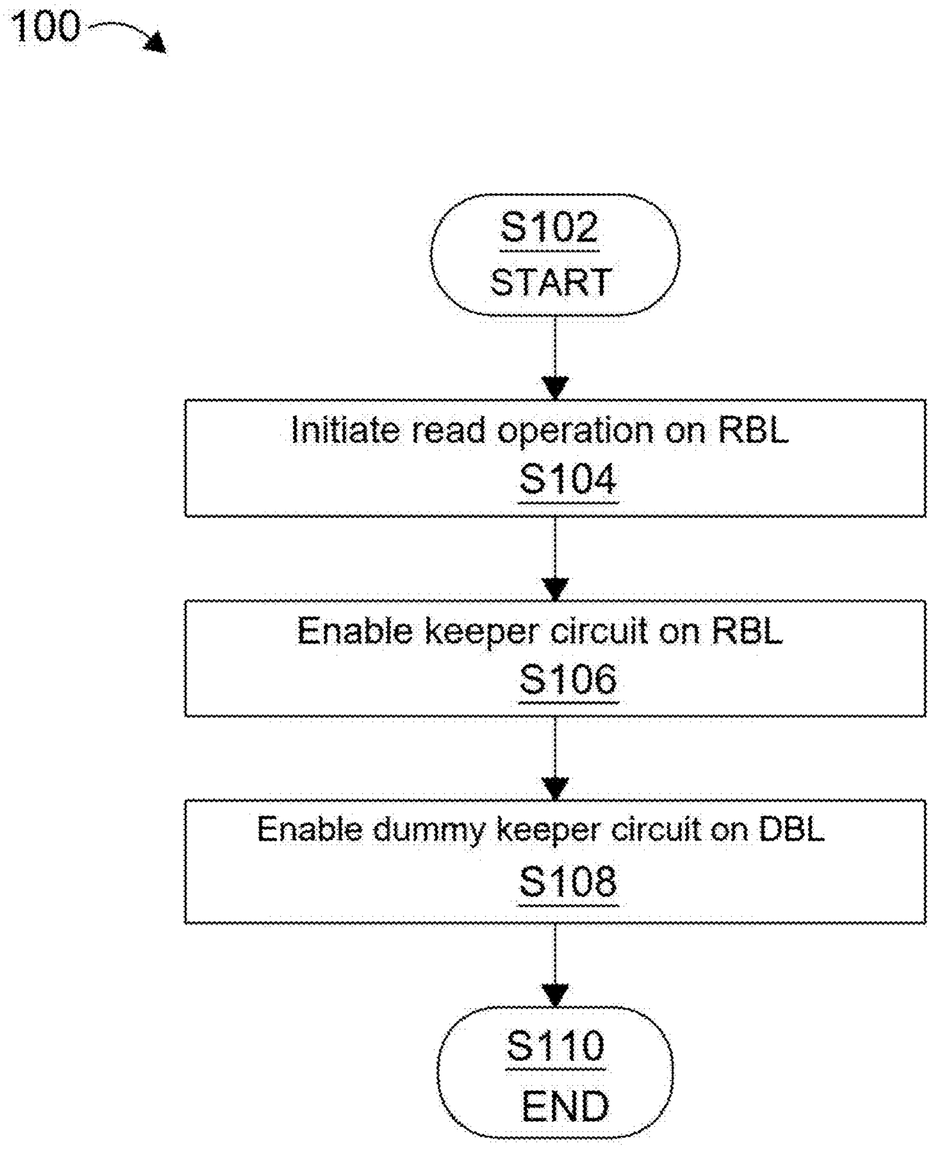
FIG. 8 is a flow diagram of a dummy keeper circuit operating in accordance with the present techniques.

FIG. 8 is a flow diagram for of a method 100 for operating a storage system in accordance with the present techniques.

At S102 the method starts.

At S104 a read operation for a storage cell is initiated by issuing a rwl signal to read access logic for that particular storage cell on a read bitline (RBL) to which the storage cell is coupled.

At S106 a keeper circuit coupled to the RBL is enabled. The keeper circuit may be enabled so as to reduce the impact of leakage from other non-enabled storage cells that are coupled to the associated RBL.

At S108 a dummy keeper circuit on an associated dummy bitline (DBL) is enabled with the keeper circuit.

At S110 the outputs of the RBL (e.g. a rbl signal) and the DBL (a dbl signal) are obtained by control circuitry.

At S112 the behaviour of the RBL and DBL are compared.

At S114 an action may be taken when the behaviour is determined to have diverged outside a threshold behaviour margin. Such an action may, for example, comprising issuing one or more control signals to modify operation of the storage system. For example, when it is determined that the dbl signal is faster (e.g. higher slope) than the rbl then a read margin may be adjusted in response to the one or more control signals.

Figure 9:
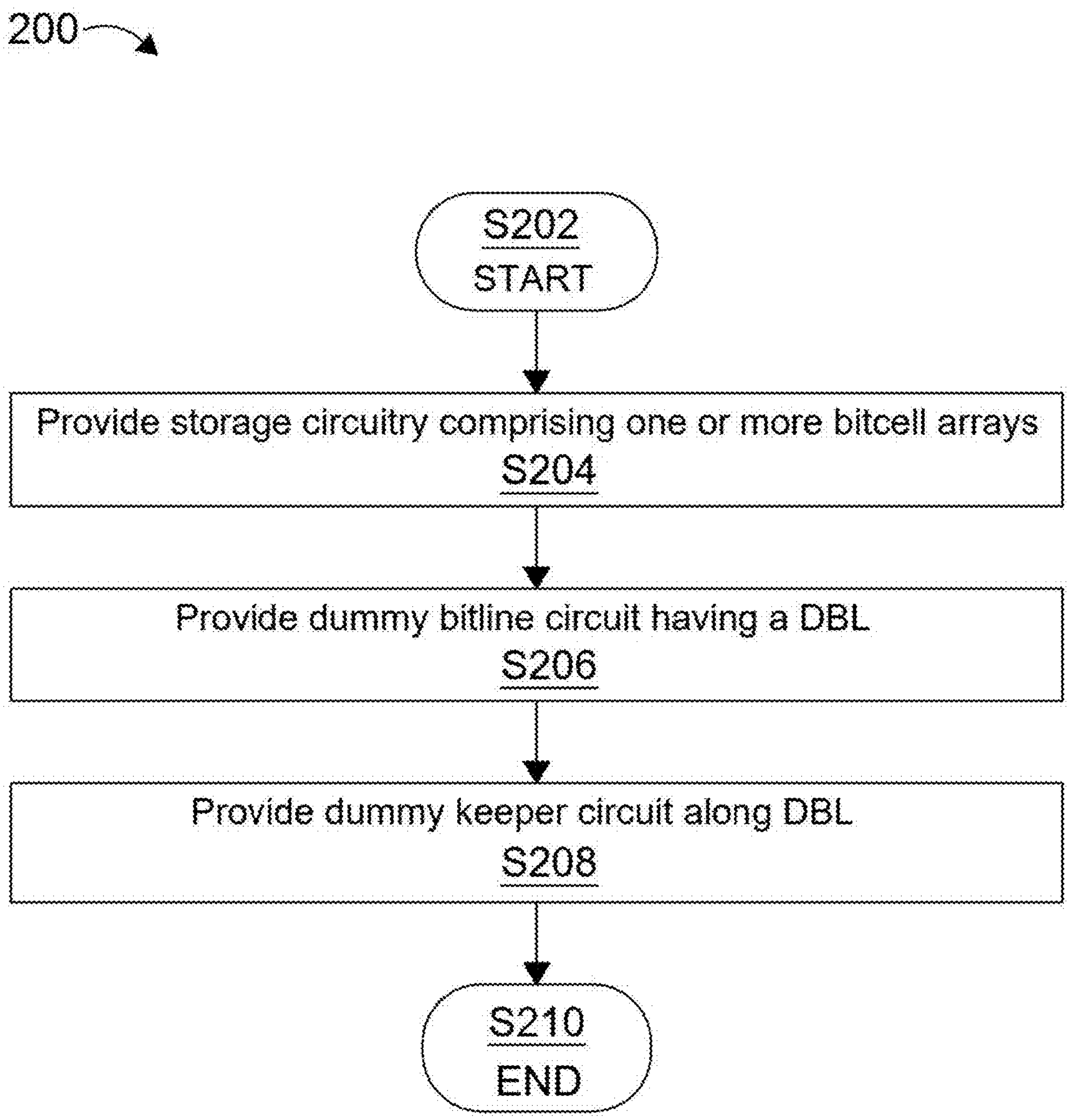
FIG. 9 is a flow diagram for providing a storage system in accordance with the present techniques.

FIG. 9 illustrates a flow diagram of a method 200 for providing a storage system in accordance with various implementations described herein.

It should be understood that even though method 200 may indicate a particular order of operation execution, in some cases, various certain portions of the operations may be executed in a different order, and on different systems. In other cases, additional operations and/or steps may be added to and/or omitted from method 200.

Also, method 200 may be implemented in hardware and/or software. When implemented in hardware, the method 200 may be implemented with various circuit elements, such as described herein above in reference to FIGS. 1, 2*a*, 2*b* and 5. When implemented in software, the method 200 may be implemented as a program and/or software instruction process that may be configured for providing DBL design techniques as described herein. Also, if implemented in software, instructions related to implementing the method 200 may be stored in memory and/or a database. For instance, a computer or various other types of computing devices having a processor and memory may be configured to perform method 200.

As described and shown in reference to FIG. 9, method 200 may be utilized for fabricating and/or manufacturing, or causing to be fabricated and/or manufactured, an integrated circuit (IC) that implements DBL design schemes and techniques as described herein that are related to providing DBL architecture and/or various associated systems, devices, components, circuits and related architecture.

At S202, method 200 starts and at S204 may provide storage circuitry with one or more bitcell arrays, each bitcell array comprising a plurality of storage cells arranged in columns and rows.

At S206, method 200 may provide, for a column of storage cell dummy bitline (DBL) circuitry with a DBL to provide a dbl signal.

At S208, method 200 may provide a dummy keeper circuit along the DBL between a first or second voltage and the DBL. In embodiments the dummy keeper circuit provides for tracking the behaviour of the RBL by the DBL.

At S210, method 200 ENDS

In some implementations, the DBL comprising the dummy keeper circuit provides improved tracking of the RBL by the DBL compared to a DBL that does not have a dummy keeper circuit. Better tracking the RBL using the DBL may provide for improved access time and increased confidence that a write or read operation is correct or true.

As will be appreciated by one skilled in the art, the present technology may be embodied as a method, a circuit or a computer readable medium comprising data and imperatives to cause construction of a circuit. Accordingly, the present technique may take the form of an entirely hardware embodiment, an entirely software embodiment, or an embodiment combining software and hardware. Where the word "component" is used, it will be understood by one of ordinary skill in the art to refer to any portion of any of the above embodiments.

The present techniques described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The present techniques described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Figure 10:
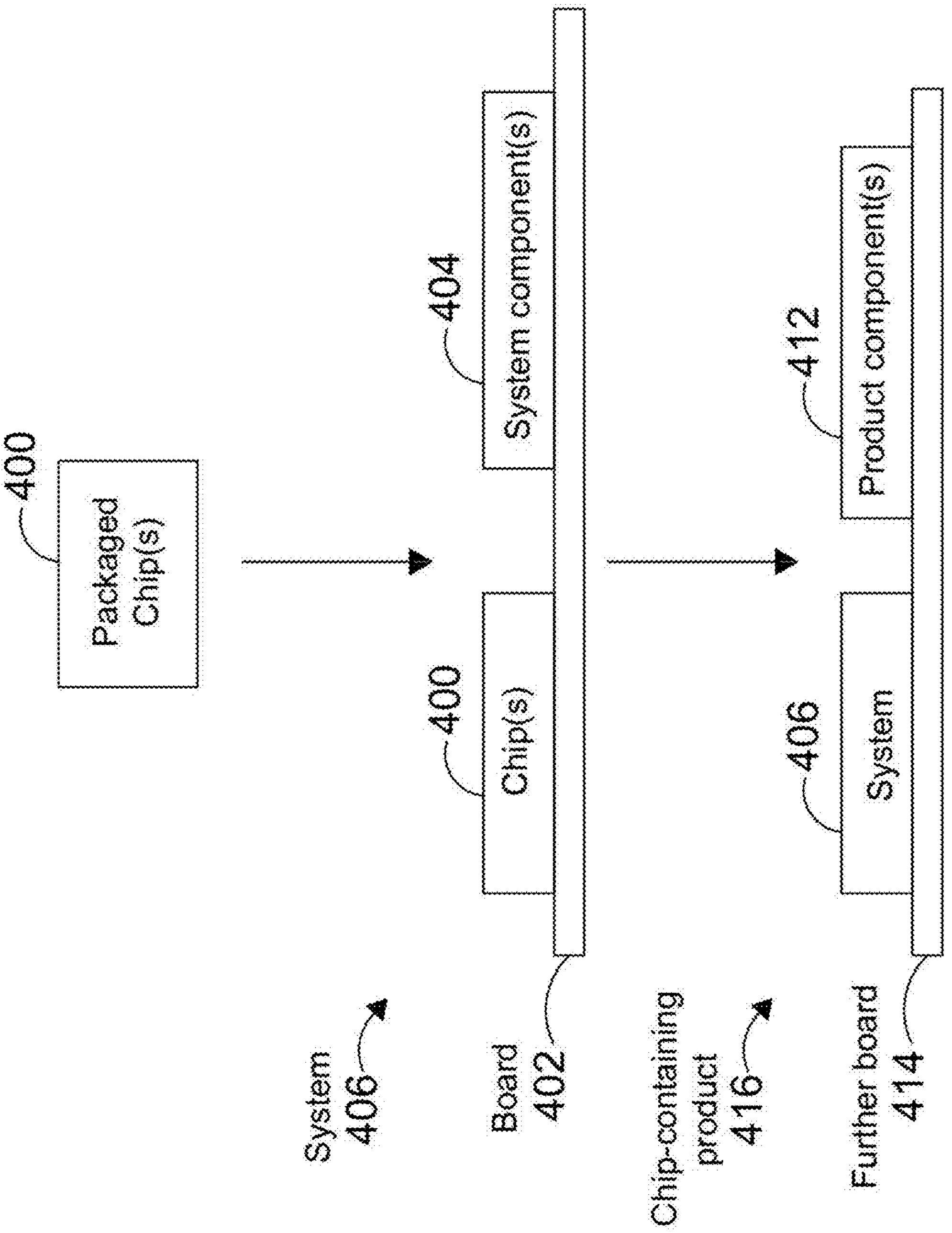
FIG. 10 shows a system and a chip-containing product.

As an illustrative example, as shown in FIG. 10, one or more packaged chips 400, with the circuitry described above implemented on one chip or distributed over two or more of the chips, may be manufactured by a semiconductor chip manufacturer. In some examples, the chip product 400 made by the semiconductor chip manufacturer may be provided as a semiconductor package which comprises a protective casing (e.g. made of metal, plastic, glass or ceramic) containing the semiconductor devices implementing the circuitry described above and connectors, such as lands, balls or pins, for connecting the semiconductor devices to an external environment. Where more than one chip 400 is provided, these could be provided as separate integrated circuits (provided as separate packages), or could be packaged by the semiconductor provider into a multi-chip semiconductor package (e.g. using an interposer, or by using three-dimensional integration to provide a multi-layer chip product comprising two or more vertically stacked integrated circuit layers).

In some examples, a collection of chiplets (i.e. small modular chips with particular functionality) may itself be referred to as a chip. A chiplet may be packaged individually in a semiconductor package and/or together with other chiplets into a multi-chiplet semiconductor package (e.g. using an interposer, or by using three-dimensional integration to provide a multi-layer chiplet product comprising two or more vertically stacked integrated circuit layers).

The one or more packaged chips 400 are assembled on a board 402 together with at least one system component 404 to provide a system 406. For example, the board may comprise a printed circuit board. The board substrate may be made of any of a variety of materials, e.g. plastic, glass, ceramic, or a flexible substrate material such as paper, plastic or textile material. The at least one system component 404 comprise one or more external components which are not part of the one or more packaged chip(s) 400. For example, the at least one system component 404 could include, for example, any one or more of the following: another packaged chip (e.g. provided by a different manufacturer or produced on a different process node), an interface module, a resistor, a capacitor, an inductor, a transformer, a diode, a transistor and/or a sensor.

A chip-containing product 416 is manufactured comprising the system 406 (including the board 402, the one or more chips 400 and the at least one system component 404) and one or more product components 412. The product components 412 comprise one or more further components which are not part of the system 406. As a non-exhaustive list of examples, the one or more product components 412 could include a user input/output device such as a keypad, touch screen, microphone, loudspeaker, display screen, haptic device, etc.; a wireless communication transmitter/receiver; a sensor; an actuator for actuating mechanical motion; a thermal control device; a further packaged chip; an interface module; a resistor; a capacitor; an inductor; a transformer; a diode; and/or a transistor. The system 406 and one or more product components 412 may be assembled on to a further board 414.

The board 402 or the further board 414 may be provided on or within a device housing or other structural support (e.g. a frame or blade) to provide a product which can be handled by a user and/or is intended for operational use by a person or company.

The system 406 or the chip-containing product 416 may be at least one of: an end-user product, a machine, a medical device, a computing or telecommunications infrastructure product, or an automation control system. For example, as a non-exhaustive list of examples, the chip-containing product could be any of the following: a telecommunications device, a mobile phone, a tablet, a laptop, a computer, a server (e.g. a rack server or blade server), an infrastructure device, networking equipment, a vehicle or other automotive product, industrial machinery, consumer device, smart card, credit card, smart glasses, avionics device, robotics device, camera, television, smart television, DVD players, set top box, wearable device, domestic appliance, smart meter, medical device, heating/lighting control device, sensor, and/or a control system for controlling public infrastructure equipment such as smart motorway or traffic lights.

As will be appreciated by one skilled in the art, the present technology may be embodied as a method, a circuit or a computer readable medium comprising data and imperatives to cause construction of a circuit. Accordingly, the present technique may take the form of an entirely hardware embodiment, an entirely software embodiment, or an embodiment combining software and hardware. Where the word "component" is used, it will be understood by one of ordinary skill in the art to refer to any portion of any of the above embodiments.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define an HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

In the present application, lists of features preceded with the phrase "at least one of" mean that any one or more of those features can be provided either individually or in combination. For example, "at least one of: [A], [B] and [C]" encompasses any of the following options: A alone (without B or C), B alone (without A or C), C alone (without A or B), A and B in combination (without C), A and C in combination (without B), B and C in combination (without A), or A, B and C in combination.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

The invention claimed is:

1. A storage system comprising:

a bitcell array comprising a plurality of storage cells arranged in one or more columns and one or more rows;

a read bitline associated with a first column to access storage cells of the first column, wherein the read bitline has a first keeper circuit coupled thereto; and a tracker bitline associated with the read bitline, wherein the tracker bitline has a second keeper circuit coupled thereto, and wherein the tracker bitline is configured such that a behavior thereof is to substantially match a behavior of the read bitline, wherein the second keeper circuit comprises a plurality of transistor components between the tracker bitline and a first voltage level, and wherein at least a first transistor component of the plurality of transistor components is controlled responsive to a control signal for the first keeper circuit.

2. The storage system of claim 1, wherein a tracker bitline signal output from the tracker bitline is provided to control logic.

3. The storage system of claim 2, wherein the behavior of the tracker bitline to substantially match the behavior of the read bitline comprises: a characteristic or property of the tracker bitline signal to substantially match a characteristic or property of a read bitline signal.

4. The storage system of claim 3, wherein the characteristic or property of the tracker bitline signal comprises one or more of: a pulse width, a frequency and a pulse height or level.

5. The storage system of claim 3 comprising:

a control circuitry configured to receive the read bitline signal and the tracker bitline signal and to take an action responsive to a comparison of the characteristic or property of the read bitline signal and the characteristic or property of the tracker bitline signal diverging outside a threshold.

6. The storage system of claim 5, wherein the action comprises:

to issue a control signal to control a property or characteristic of a component, circuit or element of the storage system.

7. The storage system of claim 5, wherein the action comprises:

to adjust a property of a global timing pulse of clock generation circuitry.

8. The storage system of claim 5, wherein the action comprises:

to adjust a read access margin.

9. The storage system of claim 1, wherein the first voltage level is a supply voltage level.

10. The storage system of claim 9, wherein the supply voltage comprises a voltage level between 0.4V and 1.2V.

11. The storage system of claim 1, wherein the first voltage level is a ground voltage level.

12. The storage system of claim 1, wherein a further transistor component of the plurality of transistor components is controlled responsive to an inverted dummy bitline signal from the tracker bitline.

13. The storage system of claim 1, wherein the plurality of transistor components comprise PMOS transistors.

14. The storage system of claim 1, wherein the plurality of transistor components comprise at least one PMOS transistor and at least one NMOS transistor, wherein the NMOS transistor is controlled responsive to an output of the PMOS transistor.

15. The storage system of claim 1, wherein the configuration of the second keeper circuit is substantially identical to the configuration of the first keeper circuit.

16. The storage system of claim 1, wherein the storage system comprises a single-ended storage system.

17. A method of operating a storage system, the storage system including:

a bitcell array comprising a plurality of storage cells arranged in one or more columns and one or more rows; a read bitline associated with a first column to access storage cells of the first column, wherein the read bitline has a keeper circuit coupled thereto; and a tracker bitline associated with the read bitline, wherein the tracker bitline has a second keeper circuit, wherein the second keeper circuit comprises a plurality of transistor components between the tracker bitline and a first voltage level, and wherein at least a first transistor component of the plurality of transistor components is controlled responsive to a control signal for the first keeper circuit;

the method comprising: enabling the keeper circuit and the second keeper circuit during a read operation, wherein a behavior of the tracker bitline is configured to substantially match a behavior of the read bitline.

18. A method, comprising:

providing storage circuitry with a bitcell array comprising a plurality of storage cells arranged in one or more columns and one or more rows;

coupling a read bitline read bitline to a first column for accessing storage cells of the first column, coupling a first keeper circuit to the read bitline;

providing a tracker bitline associated with the read bitline;

coupling a second keeper circuit to the tracker bitline, wherein a behavior of the tracker bitline is configured to substantially match a behavior of the read bitline, wherein the second keeper circuit comprises a plurality of transistor components between the tracker bitline and a first voltage level, and wherein at least a first transistor component of the plurality of transistor components is controlled responsive to a control signal for the first keeper circuit.

* * * * *